(12) United States Patent
Lee et al.

(10) Patent No.: US 7,687,350 B2
(45) Date of Patent: Mar. 30, 2010

(54) METHOD FOR MANUFACTURING SEMICONDUCTOR MEMORY DEVICE USING ASYMMETRIC JUNCTION ION IMPLANTATION

(75) Inventors: Min Yong Lee, Seoul (KR); Kyoung Bong Rouh, Goyang-si (KR); Seung Woo Jin, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 895 days.

(21) Appl. No.: 11/450,816

(22) Filed: Jun. 9, 2006

(65) Prior Publication Data
US 2007/0065999 A1    Mar. 22, 2007

(30) Foreign Application Priority Data
Sep. 21, 2005  (KR)  .................. 10-2005-0087890

(51) Int. Cl.
*H01L 21/336* (2006.01)
(52) U.S. Cl. .................. 438/268; 257/E21.058
(58) Field of Classification Search .............. 438/268; 257/E21.057, E21.058
See application file for complete search history.

(56) References Cited

U.S. PATENT DOCUMENTS 5,925,914 A    7/1999  Jiang et al. ................ 257/344
6,596,594 B1   7/2003  Guo ........................... 438/279
2005/0133836 A1* 6/2005 Seo et al. ................... 257/288

FOREIGN PATENT DOCUMENTS

| JP | 10-056147 | 2/1998 |
|----|-----------|--------|
| KR | 10-1999-0052693 | 7/1999 |
| KR | 10-2001-0005300 A | 1/2001 |
| KR | 10-2004-0008725 A | 1/2004 |
| KR | 10-2005-0063897 A | 6/2005 |

OTHER PUBLICATIONS

Machine Translation of KR 10-2004-0008725.*

* cited by examiner

*Primary Examiner*—W. David Coleman
*Assistant Examiner*—Sonya D McCall-Shepard
(74) *Attorney, Agent, or Firm*—Marshall, Gerstein & Borun LLP

(57) ABSTRACT

A method for manufacturing a semiconductor memory device using asymmetric junction ion implantation, including performing ion implantation for adjusting a threshold voltage to a semiconductor substrate, forming a gate stack on the semiconductor substrate to define a storage node junction region and a bit line junction region, implanting a first conductive impurity ion and a second conductive impurity ion using a mask layer pattern covering the storage node junction region while exposing the bit line junction region, forming a gate spacer layer at both sides of the gate stack, and implanting the first conductive impurity ion using the gate stack and the gate spacer layer as an ion implantation mask layer to form a storage node junction region and a bit line junction region having different impurity concentrations, and different junction depths from each other.

8 Claims, 8 Drawing Sheets

METHOD FOR MANUFACTURING SEMICONDUCTOR MEMORY DEVICE USING ASYMMETRIC JUNCTION ION IMPLANTATION

BACKGROUND OF THE INVENTION

1. Field of the Invention

The invention relates generally to a method for manufacturing a semiconductor memory device and, more particularly, to a method for manufacturing a semiconductor memory device using asymmetric junction ion implantation.

2. Description of the Related Art

Rapid development in the technology of increasing the degree of integration on semiconductor memory devices has caused a rapid decrease in channel length of transistors in such devices. As the channel length is decreased, operating characteristics of the device deteriorate due to various problems caused by a short channel effect. For example, a decrease of the channel length causes an increase in intensity of electric field near a drain region, which in turn generates hot carriers, thereby deteriorating the operating characteristics and stability of the device. In another example, for a semiconductor memory device such as dynamic random access memory (DRAM), the increase in intensity of electric field in a cell region causes current leakage, which in turn deteriorates refresh characteristics of the device.

In order to suppress the short channel effect as described above, various structures have been suggested, which can increase an effective channel length without decreasing the integration degree of the device. For example, such a structure includes a recess cell structure, and a step gate asymmetric recess structure. For the recess cell structure, a gate stack is formed by forming trenches on a substrate, and then burying the trenches with a gate conductive layer. In this recess channel structure, since the channel is formed along peripheries of the trenches, it has an increased effective length. For the step gate asymmetric recess structure, both sides of a gate stack are asymmetrically disposed by forming a step profile on a substrate, and then forming a gate stack on the step profile. In this step gate asymmetric recess structure, since the channel is formed along the step profile, it also has an increased effective length.

Meanwhile, there is an attempt to improve the refresh characteristics by making a storage node junction region and a bit line junction region to have different impurity concentrations, in addition to employment of such a three-dimensional cell structure. In other words, after forming the gate stack, p-type impurities are implanted by threshold voltage ion implantation to a bit line contact region using a mask layer pattern which allows only the bit line contact region to be exposed. Next, after removing the mask layer pattern, a gate spacer layer is formed, and then source/drain junction ion implantation is performed using a typical method, so that an impurity concentration of a channel region near the storage node junction region is lower than that of a channel region near the bit line junction region, thereby reducing current leakage, and enhancing the refresh characteristics of the device.

Meanwhile, in order to achieve high integration of 100 nm or less, it is necessary to ensure further improved refresh characteristics, and data retention time. However, it is difficult for the conventional method of asymmetric threshold voltage ion implantation to satisfy such requirements.

GENERAL DESCRIPTION OF THE INVENTION

The invention provides a method for manufacturing a semiconductor memory device, which can actively induce asymmetric distribution in concentration between a storage node junction region and a bit line junction region, thereby improving refresh characteristics while extending data retention time.

In accordance with one aspect, the invention provides a method for manufacturing a semiconductor memory device, including the steps of:

performing ion implantation for adjusting a threshold voltage to a semiconductor substrate;

forming a gate stack on the semiconductor substrate to define a storage node junction region and a bit line junction region;

implanting a first conductive impurity ion and a second conductive impurity ion using a mask layer pattern covering the storage node junction region while exposing the bit line junction region;

forming a gate spacer layer at both sides of the gate stack; and implanting the first conductive impurity ion using the gate stack and the gate spacer layer as an ion implantation mask layer to form a storage node junction region and a bit line junction region having different impurity concentrations, and different junction depths from each other.

Preferably, the first conductive impurity ion is an n-type ion, and the second conductive impurity ion is a p-type ion.

At the step of implanting the first conductive impurity ion and the second conductive impurity ion using the mask layer pattern, the first conductive impurity ion may be implanted prior to the second conductive impurity ion, or vice versa.

The step of implanting the first conductive impurity ion and the second conductive impurity ion using the mask layer pattern may be performed after forming the gate spacer layer.

Preferably, the impurity concentration of the storage node junction region is about 70% to about 90% that of the bit line junction region.

In this case, at the step of implanting the first conductive impurity ion using the mask layer pattern, the first conductive impurity ion is preferably implanted in a concentration of about 10% to about 30% of a final impurity concentration of the bit line junction region.

At the step of implanting the first conductive impurity ion to form the storage node junction region and the bit line junction region, the first conductive impurity ion is preferably implanted in a concentration of about 70% to about 90% of the final impurity concentration of the bit line junction region.

In accordance with another aspect, the invention provides a method for manufacturing a semiconductor memory device including the steps of:

forming trenches for a recess channel on a semiconductor substrate;

performing ion implantation for adjusting a threshold voltage to the semiconductor substrate having the trenches for the recess channel formed thereon;

forming an upwardly protruded gate stack on the semiconductor substrate while burying the trenches for the recess channel to define a storage node junction region and a bit line junction region;

implanting a first conductive impurity ion and a second conductive impurity ion using a mask layer pattern covering the storage node junction region while exposing the bit line junction region;

forming a gate spacer layer at both sides of the gate stack; and implanting the first conductive impurity ion using the gate stack and the gate spacer layer as an ion implantation mask layer to form a storage node junction region and a bit line junction region having different impurity concentrations, and different junction depths from each other.

Preferably, the first conductive impurity ion is an n-type ion, and the second conductive impurity ion is a p-type ion.

At the step of implanting the first conductive impurity ion and the second conductive impurity ion using the mask layer pattern, the first conductive impurity ion may be implanted prior to the second conductive impurity ion, or vice versa.

The step of implanting the first conductive impurity ion and the second conductive impurity ion using the mask layer pattern may be performed after forming the gate spacer layer.

Preferably, the impurity concentration of the storage node junction region is about 70% to about 90% that of the bit line junction region.

In this case, at the step of implanting the first conductive impurity ion using the mask layer pattern, the first conductive impurity ion is implanted in a concentration of about 10% to about 30% of a final impurity concentration of the bit line junction region.

At the step of implanting the first conductive impurity ion to form the storage node junction region and the bit line junction region, the first conductive impurity ion is preferably implanted in a concentration of about 70% to about 90% of the final impurity concentration of the bit line junction region.

In accordance with yet another aspect, the invention provides a method for manufacturing a semiconductor memory device, including the steps of:

forming a step profile by removing a portion of a semiconductor substrate;

performing ion implantation for adjusting a threshold voltage to the semiconductor substrate having the step profile formed thereon;

forming a gate stack overlapping the step profile on the semiconductor substrate to define a storage node junction region and a bit line junction region;

implanting a first conductive impurity ion and a second conductive impurity ion using a mask layer pattern covering the storage node junction region while exposing the bit line junction region;

forming a gate spacer layer at both sides of the gate stack; and implanting the first conductive impurity ion using the gate stack and the gate spacer layer as an ion implantation mask layer to form a storage node junction region and a bit line junction region having different impurity concentrations, and different junction depths from each other.

Preferably, the first conductive impurity ion is an n-type ion, and the second conductive impurity ion is a p-type ion.

At the step of implanting the first conductive impurity ion and the second conductive impurity ion using the mask layer pattern, the first conductive impurity ion may be implanted prior to the second conductive impurity ion, or vice versa.

The step of implanting the first conductive impurity ion and the second conductive impurity ion using the mask layer pattern may be performed after forming the gate spacer layer.

Preferably, the impurity concentration of the storage node junction region is about 70% to about 90% that of the bit line junction region.

In this case, at the step of implanting the first conductive impurity ion using the mask layer pattern, the first conductive impurity ion is implanted in a concentration of about 10% to about 30% of a final impurity concentration of the bit line junction region.

At the step of implanting the first conductive impurity ion to form the storage node junction region and the bit line junction region, the first conductive impurity ion is implanted in a concentration of about 70% to about 90% of the final impurity concentration of the bit line junction region.

BRIEF DESCRIPTION OF THE DRAWINGS

The invention will be more clearly understood from the following detailed description taken in conjunction with the accompanying drawings, in which.

DESCRIPTION OF THE PREFERRED EMBODIMENTS

Preferred embodiments of the invention will be described in detail with reference to the accompanying drawings. These embodiments do not limit the scope of the invention, but are provided for the purpose of more complete illustration to those skilled in the art.

FIGS. 1 to 4 are cross-sectional views illustrating a method for manufacturing a semiconductor memory device in accordance with a first embodiment of the invention. In this embodiment, the method can be applied to a semiconductor memory device having a planar structure.

Figure 1:
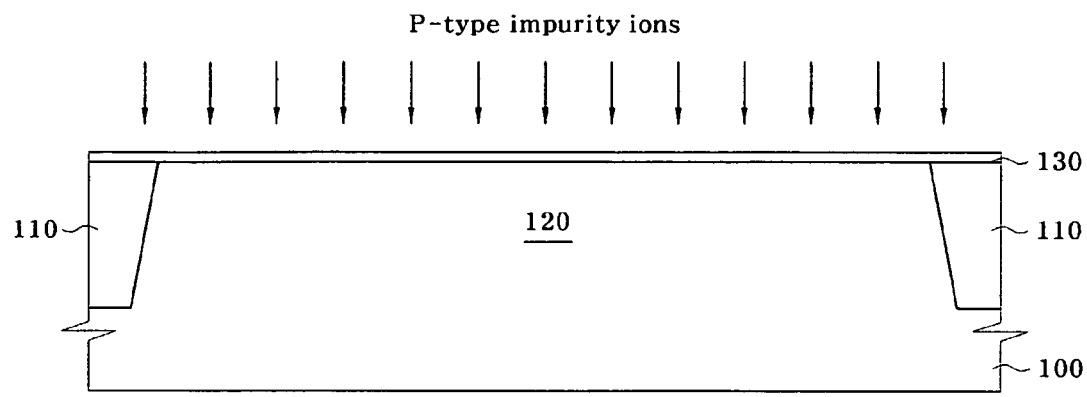
FIGS. 1 to 4 are cross-sectional views illustrating a method for manufacturing a semiconductor memory device in accordance with a first embodiment of the invention.

Referring to FIG. 1, an active region 120 is defined by forming isolation layers 110 on a semiconductor substrate 100. Then, a buffer insulation layer 130 is formed of an oxide layer on the semiconductor substrate 100 having the active region 120 defined thereon. Next, as indicated by arrows in FIG. 1, ion implantation for channel threshold voltage is performed on an overall surface of the semiconductor substrate 100. This embodiment will be described using an n-type channel as an example. Accordingly, p-type impurity ions are implanted to an upper portion of the semiconductor substrate 100 by the ion implantation for channel threshold voltage. The p-type impurity ions are implanted in a concentration about 70% of an entire channel concentration.

Figure 2:
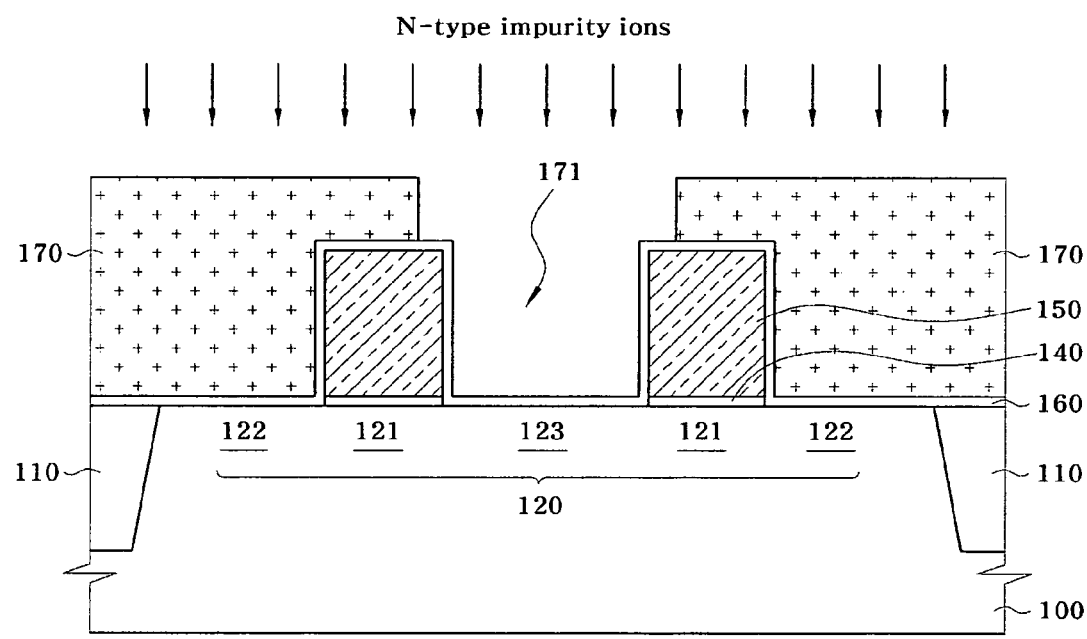

Referring to FIG. 2, a gate stack 150 is formed on the semiconductor substrate 100 with a gate insulation layer 140 interposed therebetween. Typically, the gate stack 150 has a structure wherein a polysilicon layer, a tungsten silicide layer, and a nitride layer are sequentially stacked. However, the invention is not limited to this structure. As the gate insulation layer 140 and the gate stack 150 are formed, the active region 120 of the semiconductor substrate 100 can be divided into a channel region 121 overlapping the gate insulation layer 140, a storage node junction region 122, and a bit line junction region 123.

Then, after forming a liner oxide layer 160 on the overall surface, a mask layer pattern 170 for asymmetric junction ion implantation is formed thereon. The mask layer pattern 170 may be formed of a photoresist layer. The mask layer pattern 170 has an opening 171 which covers the storage node junction region 122 while exposing only the bit line junction region 123. Next, as indicated by arrows in FIG. 2, n-type impurity ions are implanted to the bit line junction region 123 by performing the asymmetric junction ion implantation using the mask layer pattern 170 as an ion implantation mask. The n-type impurity ions are implanted in a concentration about 10% to about 30% of a final concentration in the bit line junction region 123.

Figure 3:
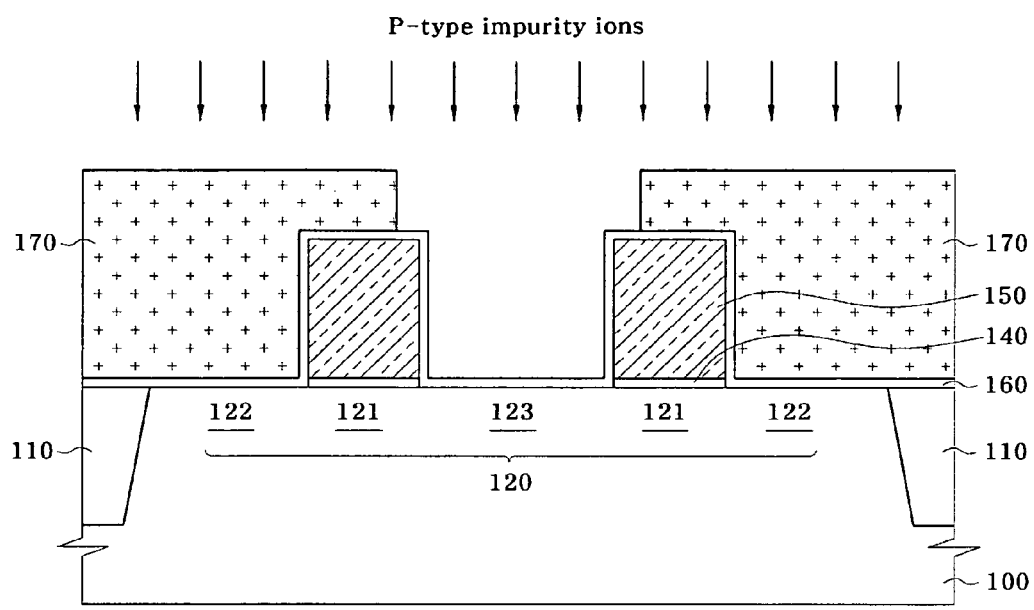

Next, referring to FIG. 3, as indicated by arrows, p-type impurity ions are implanted to the bit line junction region 123 by performing asymmetric threshold voltage ion implantation using the mask layer pattern 170 as the ion implantation mask. The p-type impurity ions are implanted in a concentration about 30% of a final channel concentration. As such, both the asymmetric junction ion implantation and the asymmetric threshold voltage ion implantation are performed using the same mask layer pattern 170, so that the n-type impurity ions and the p-type impurity ions are not implanted to the storage node junction region 122 during the asymmetric junction ion implantation and the asymmetric threshold voltage ion implantation, respectively.

Figure 4:
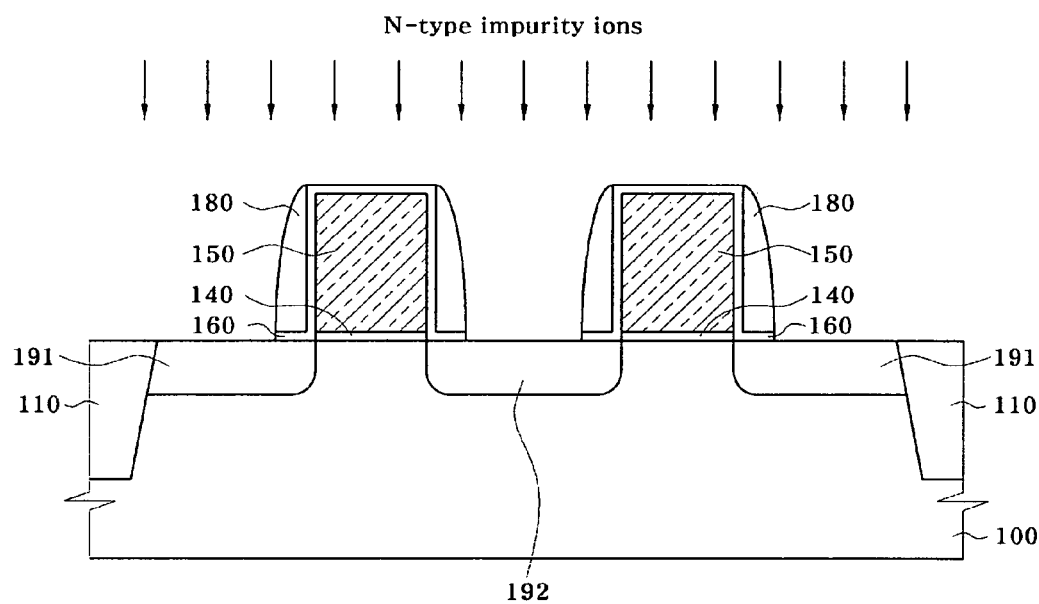

Referring to FIG. 4, the mask layer pattern 170 is removed. Then, a gate spacer layer 180 is formed at both sides of the gate stack 150. The gate spacer layer 180 is formed of a nitride layer. Then, as indicated by arrows in FIG. 4, n-type impurity ions are implanted to the semiconductor substrate 100 by performing junction forming ion implantation using the gate stack 140 and the gate spacer layer 180 as the ion implantation mask. The n-type impurity ions may be phosphorous (P), arsenic (As), antimony (Sb), bismuth (Bi), and the like. The n-type impurity ions are implanted in a concentration about 70% to about 90% of the final concentration in the bit line junction region 123. With such junction forming ion implantation, a storage node junction region 191 and a bit line junction region 192 are formed on the semiconductor substrate 100. Here, the storage node junction region 191 has an overall channel concentration gradient about 70% that of the bit line junction region 192, and the junction region has the concentration gradient about 70% to about 90% that of the bit line junction region 123.

Meanwhile, prior to forming the gate spacer layer 180, the n-type impurity ions may be implanted in a lower concentration in order to form a lightly doped drain (LDD) structure. In addition, the asymmetric junction ion implantation and the asymmetric threshold voltage ion implantation may be performed in reverse sequence. Furthermore, the asymmetric junction ion implantation may be performed using an additional mask pattern after forming the gate spacer layer 180. Alternatively, the asymmetric junction ion implantation and the asymmetric threshold voltage ion implantation may be performed after forming the gate spacer layer 180.

FIGS. 5 to 8 are cross-sectional views illustrating a method for manufacturing a semiconductor memory device in accordance with a second embodiment of the invention. The second embodiment is different from the first embodiment in that the second embodiment may be applied to a semiconductor memory device having a recess channel structure.

Figure 5:
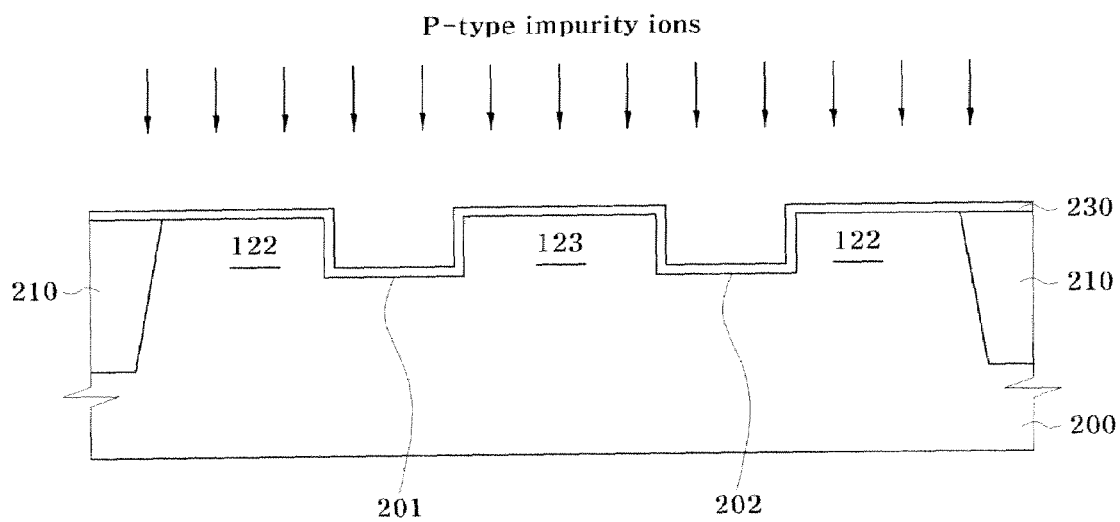
FIGS. 5 to 8 are cross-sectional views illustrating a method for manufacturing a semiconductor memory device in accordance with a second embodiment of the invention.

Now referring to FIG. 5, an active region is defined by forming isolation layers 210 on a semiconductor substrate 200. Then, trenches 201 and 202 for a recess channel are formed by etching a portion of the active region on the semiconductor substrate 200 by a predetermined depth. As the trenches 201 and 202 for the recess channel are formed, the active region of the semiconductor substrate is defined with a channel region formed along the trenches 201 and 202 for the recess channel, a storage node junction region 122, and a bit line junction region 123. Then, a buffer insulation layer 230 is formed of an oxide layer on the semiconductor substrate 200 having the trenches 201 and 202 for the recess channel formed thereon. In some cases, a natural oxide layer may be used as the buffer insulation layer 230. Next, as indicated by arrows in FIG. 5, ion implantation for channel threshold voltage is performed on the overall surface of the semiconductor substrate 200. The second embodiment will also be described using an n-type channel as an example. Accordingly, p-type impurity ions are implanted to an upper portion of the semiconductor substrate 200 by the ion implantation for channel threshold voltage. The p-type impurity ions are implanted in a concentration about 70% of an entire channel concentration.

Figure 6:
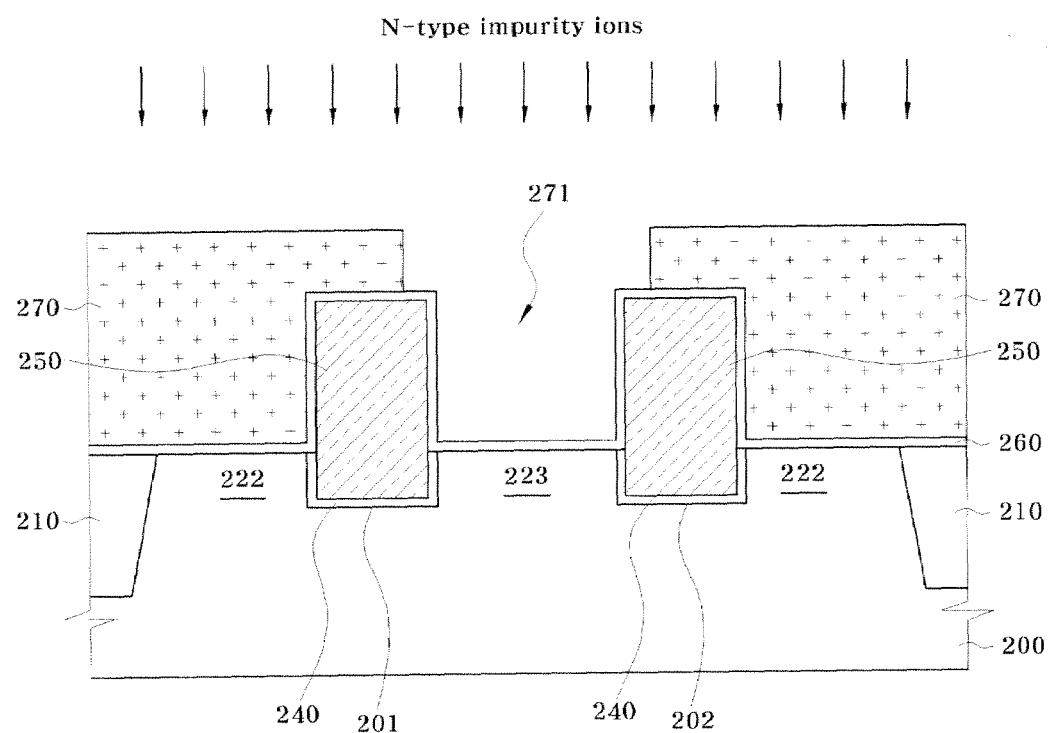

Referring to FIG. 6, a gate insulation layer 240 is formed on the semiconductor substrate 200 in the trenches 201 and 202 for the recess channel. Then, a material layer (not shown) for a gate stack is formed on the overall surface to fill the trenches 201 and 202 for the recess channel. Typically, the material layer has a structure wherein a polysilicon layer, a tungsten silicide layer, and a nitride layer are sequentially stacked. The invention is not limited to this structure. Next, by patterning the material layer for the gate stack, a gate stack 250 is formed such that the gate stack 250 is protruded upwardly by a predetermined height or more while burying the trenches 201 and 202 for the recess channel.

Then, after forming a liner oxide layer 260 on the overall surface, a mask layer pattern 270 for asymmetric junction ion implantation is formed thereon. In some cases, formation of the liner oxide layer 260 may be omitted. The mask layer pattern 170 may be formed of a photoresist layer. The mask layer pattern 170 has an opening 271 which covers the storage node junction region 222 while exposing only the bit line junction region 223. Next, as indicated by arrows in FIG. 6, n-type impurity ions are implanted to the bit line junction region 223 by performing the asymmetric junction ion implantation using the mask layer pattern 270 as an ion implantation mask. The n-type impurity ions are implanted in a concentration about 10% to about 30% of a final concentration in the bit line junction region 223.

Figure 7:
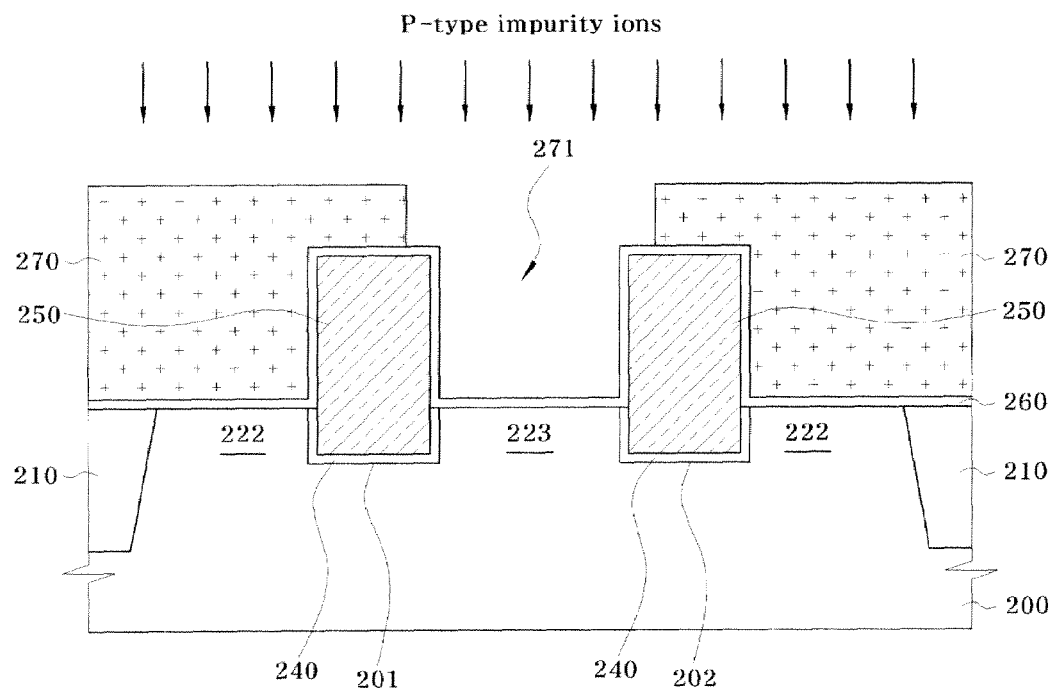

Next, referring to FIG. 7, as indicated by arrows, p-type impurity ions are implanted to the bit line junction region 223 by performing asymmetric threshold voltage ion implantation using the mask layer pattern 270 as the ion implantation mask. The p-type impurity ions are implanted in a concentration about 30% of a final channel concentration. In this embodiment, both the asymmetric junction ion implantation and the asymmetric threshold voltage ion implantation are also performed using the same mask layer pattern 270 so that the n-type impurity ions and the p-type impurity ions are not implanted to the storage node junction region 222 during the asymmetric junction ion implantation and the asymmetric threshold voltage ion implantation, respectively.

Figure 8:
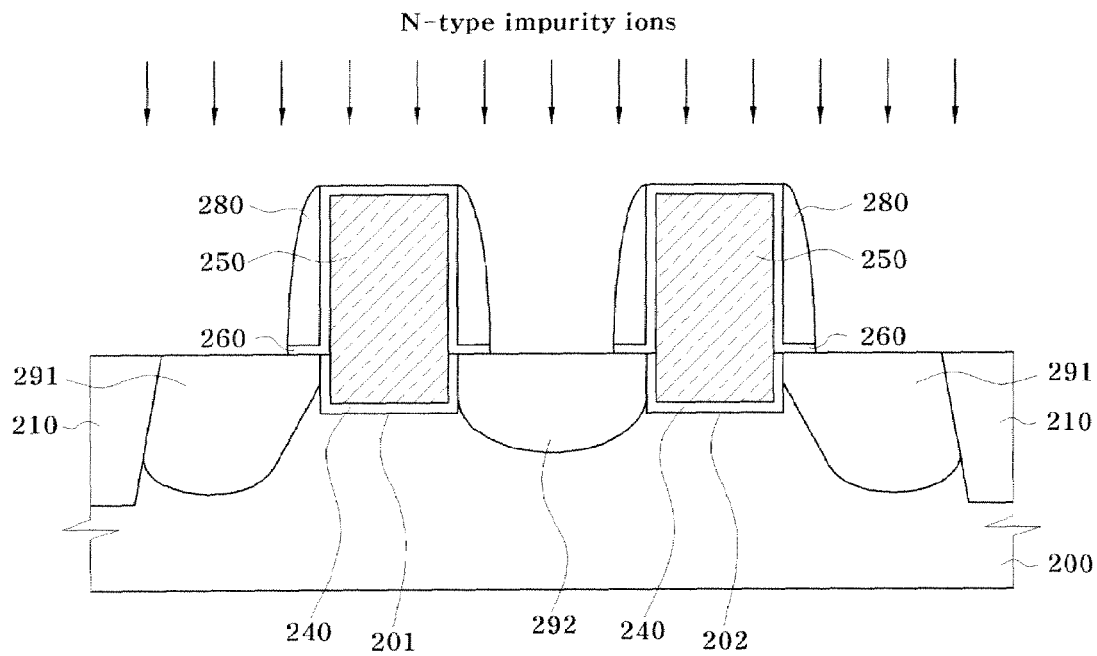

Referring to FIG. 8, the mask layer pattern 270 is removed. Then, a gate spacer layer 280 is formed at both sides of the gate stack 250. The gate spacer layer 280 is formed of a nitride layer. Then, as indicated by arrows in FIG. 8, n-type impurity ions are implanted to the semiconductor substrate 200 by performing junction forming ion implantation using the gate stack 240 and the gate spacer layer 280 as the ion implantation mask. The n-type impurity ions may be phosphorous (P), arsenic (As), antimony (Sb), bismuth (Bi), and the like. The n-type impurity ions are implanted in a concentration about 70% to about 90% of the final concentration in the bit line junction region 123. With such junction forming ion implantation, a storage node junction region 291 and a bit line junction region 292 are formed on the semiconductor substrate 200. Here, the storage node junction region 291 has an overall channel concentration gradient about 70% that of the bit line junction region 292. In particular, the concentration gradient of the storage node junction region 291 is about 70% to about 90% that of the bit line junction region 292, so that asymmetry is further increased in comparison to the conventional method. In addition, the storage node junction region 291 also has a deeper junction depth than that of the bit line junction region 292, and a difference in depth between the storage node junction region 291 and the bit line junction region 292 is also greater than that of the conventional method.

Meanwhile, as in the first embodiment, according to the second embodiment, the n-type impurity ions may also be implanted in a lower concentration prior to forming the gate spacer layer 280 in order to form a lightly doped drain (LDD) structure. In addition, the asymmetric junction ion implantation and the asymmetric threshold voltage ion implantation may be performed in reverse sequence. Furthermore, the asymmetric junction ion implantation may be performed using an additional mask pattern after forming the gate spacer layer 280. Alternatively, the asymmetric junction ion implantation and the asymmetric threshold voltage ion implantation may be performed after forming the gate spacer layer 280.

FIGS. 9 to 12 are cross-sectional views illustrating a method for manufacturing a semiconductor memory device in accordance with a third embodiment of the invention. The third embodiment is different from the first and second embodiments in that the third embodiment may be applied to a semiconductor memory device having a gate structure of a step profile.

Figure 9:
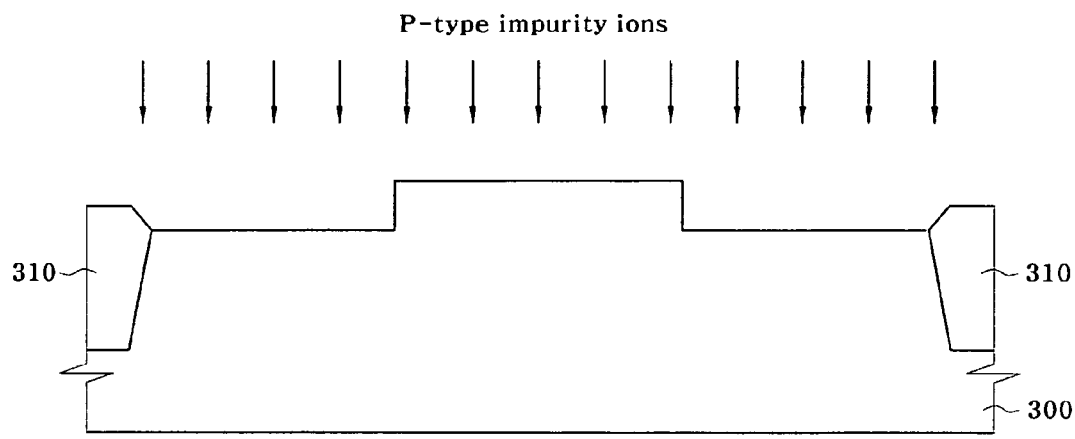
FIGS. 9 to 12 are cross-sectional views illustrating a method for manufacturing a semiconductor memory device in accordance with a third embodiment of the invention.

Now referring to FIG. 9, an active region is defined by forming isolation layers 310 on a semiconductor substrate 300. Then, a step profile is formed by etching a portion of the active region on the semiconductor substrate 300 by a predetermined depth. Then, as indicated by arrows in FIG. 9, ion implantation for channel threshold voltage is performed on an overall surface of the semiconductor substrate 300 having the step profile formed thereon. Although not shown in the drawing, a natural oxide layer or an additional buffer insulation layer may be disposed on the semiconductor substrate 300. The third embodiment will also be described using an n-type channel as an example. Accordingly, p-type impurity ions are implanted to an upper portion of the semiconductor substrate 300 by the ion implantation for channel threshold voltage. The p-type impurity ions are implanted in a concentration about 70% of an entire channel concentration.

Figure 10:
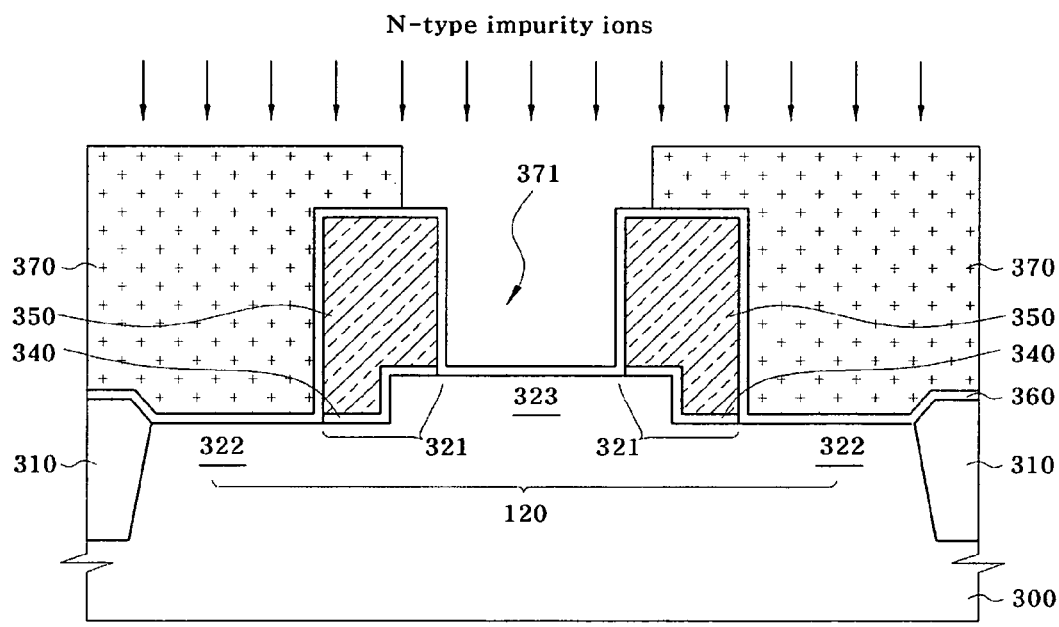

Referring to FIG. 10, a gate insulation layer 340 is formed on the semiconductor substrate 300 having the step profile formed thereon. Then, a material layer (not shown) for a gate stack is formed on the overall surface. Typically, the material layer has a structure wherein a polysilicon layer, a tungsten silicide layer, and a nitride layer are sequentially stacked. However, The invention is not limited to this structure. Next, by patterning the material layer for the gate stack, a gate stack 350 is formed to overlap the step profile. As the gate stack 350 is formed to overlap the step profile, the active region of the semiconductor substrate 300 is defined with a channel region 321 overlapping the gate stack 350 along the step profile, a storage node junction region 322, and a bit line junction region 323.

Then, after forming a liner oxide layer 360 on the overall surface, a mask layer pattern 370 for asymmetric junction ion implantation is formed thereon. In some cases, formation of the liner oxide layer 360 may be omitted. The mask layer pattern 370 may be formed of a photoresist layer. The mask layer pattern 370 has an opening 371 which covers the storage node junction region 322 while exposing only the bit line junction region 323. Next, as indicated by arrows in FIG. 10, n-type impurity ions are implanted to the bit line junction region 323 by performing the asymmetric junction ion implantation using the mask layer pattern 370 as an ion implantation mask. The n-type impurity ions are implanted in a concentration about 10% to about 30% of a final concentration in the bit line junction region 323.

Figure 11:
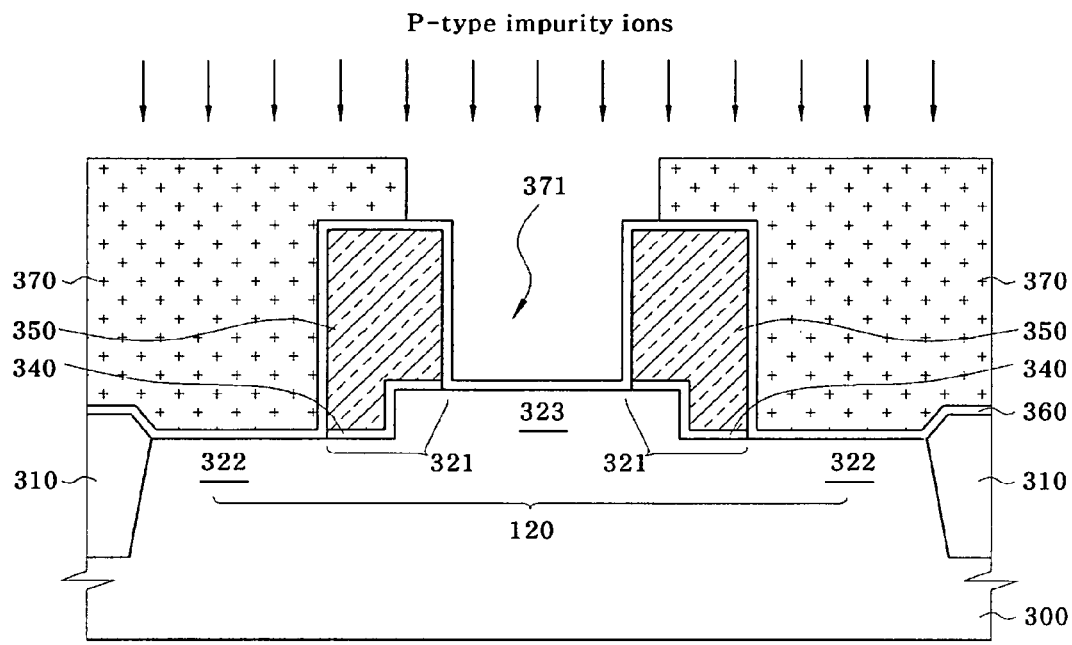

Next, referring to FIG. 11, as indicated by arrows, p-type impurity ions are implanted to the bit line junction region 323 by performing asymmetric threshold voltage ion implantation using the mask layer pattern 370 as the ion implantation mask. The p-type impurity ions are implanted in a concentration about 30% of a final channel concentration. In this embodiment, both the asymmetric junction ion implantation and the asymmetric threshold voltage ion implantation are also performed using the same mask layer pattern 370 so that the n-type impurity ions and the p-type impurity ions are not implanted to the storage node junction region 322 during the asymmetric junction ion implantation and the asymmetric threshold voltage ion implantation, respectively.

Figure 12:
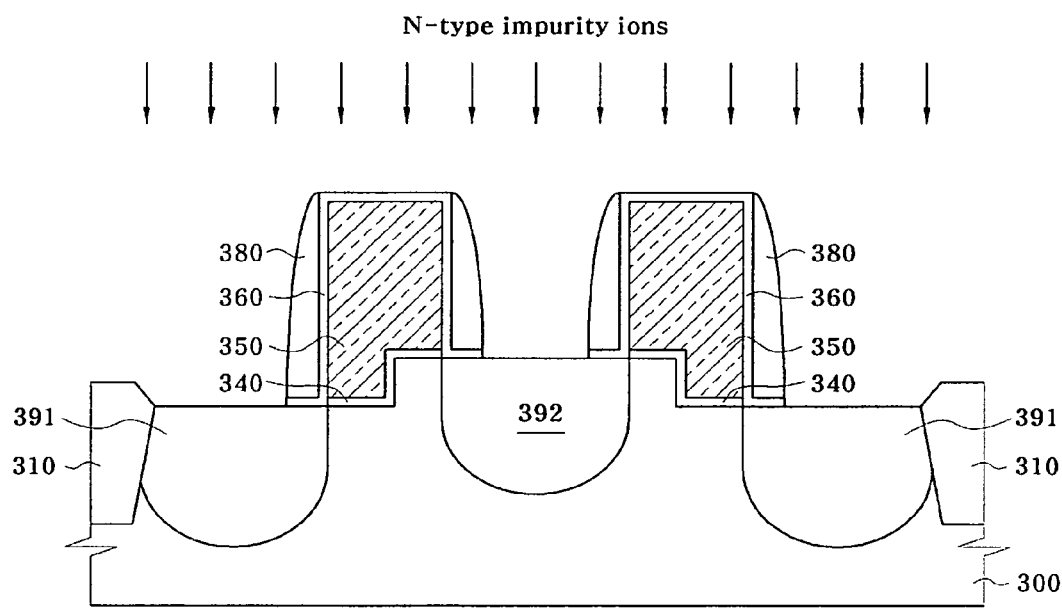

Referring to FIG. 12, the mask layer pattern 370 is removed. Then, a gate spacer layer 380 is formed at both sides of the gate stack 350. The gate spacer layer 380 is formed of a nitride layer. Then, as indicated by arrows in FIG. 12, n-type impurity ions are implanted to the semiconductor substrate 300 by performing junction forming ion implantation using the gate stack 340 and the gate spacer layer 380 as the ion implantation mask. The n-type impurity ions may be phosphorous (P), arsenic (As), antimony (Sb), bismuth (Bi), and the like. The n-type impurity ions are implanted in a concentration about 70% to about 90% of the final concentration in the bit line junction region 323. With such junction forming ion implantation, a storage node junction region 391 and a bit line junction region 392 are formed on the semiconductor substrate 300. Here, the storage node junction region 391 has an overall channel concentration gradient about 70% that of the bit line junction region 392. In particular, the concentration gradient of the storage node junction region 391 is about 70% to about 90% that of the bit line junction region 392, so that asymmetry is further increased in comparison to the conventional method. In addition, the storage node junction region 391 also has a deeper junction depth than the bit line junction region 392, and a difference in depth therebetween is also greater than that of the conventional method.

Meanwhile, as in the above embodiments, according to the third embodiment, the n-type impurity ions may also be implanted in a lower concentration prior to forming the gate spacer layer 380 in order to form a lightly doped drain (LDD) structure. In addition, the asymmetric junction ion implantation and the asymmetric threshold voltage ion implantation may be performed in reverse sequence. Furthermore, the asymmetric junction ion implantation may be performed using an additional mask pattern after forming the gate spacer layer 380. Alternatively, the asymmetric junction ion implantation and the asymmetric threshold voltage ion implantation are performed after forming the gate spacer layer 380.

Figure 13:
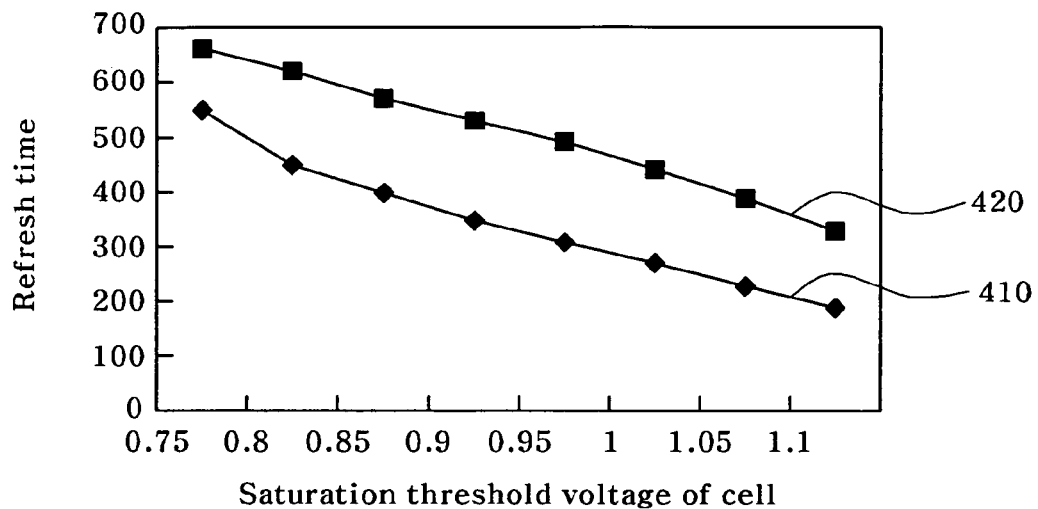
FIG. 13 is a graph for comparing a refresh time of a semiconductor memory device manufactured by the method according to the invention with that of a semiconductor memory device manufactured by a conventional method.

FIG. 13 is a graph comparing the refresh time of a semiconductor memory device manufactured by the method according to the invention with that of a semiconductor memory device manufactured by a conventional method.

In FIG. 13, a semiconductor memory device denoted by reference numeral 410 is manufactured by a conventional method in which the asymmetric junction ion implantation is omitted, and has a higher refresh time at a saturation threshold voltage of a cell than that of a semiconductor memory device manufactured by the present invention at the same cell. Thus, it can be appreciated that, since the method according to the invention includes the step of performing the asymmetric junction ion implantation, asymmetry between the storage node junction region and the bit line junction region is significantly increased, thereby enhancing the refresh characteristics.

Figure 14:
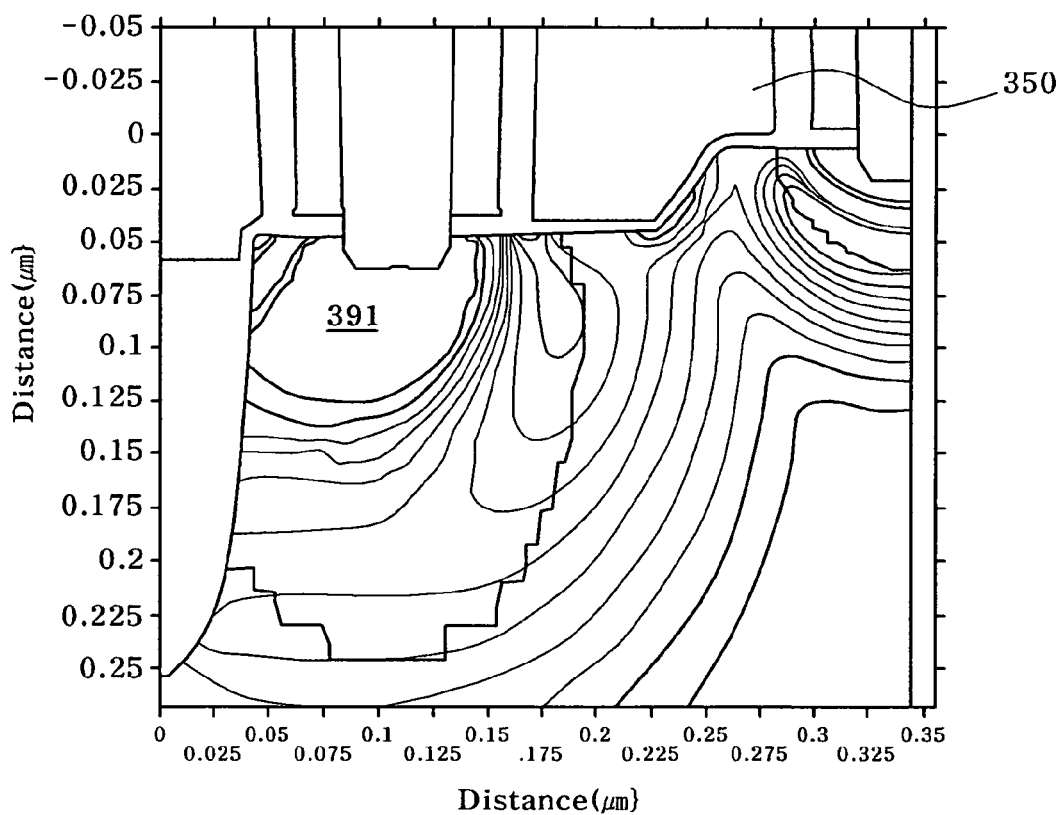
FIGS. 14 and 15 are views for comparing an electric field distribution of the semiconductor memory device manufactured by the method according to the invention with that of the semiconductor memory device manufactured by the conventional method.
Figure 15:
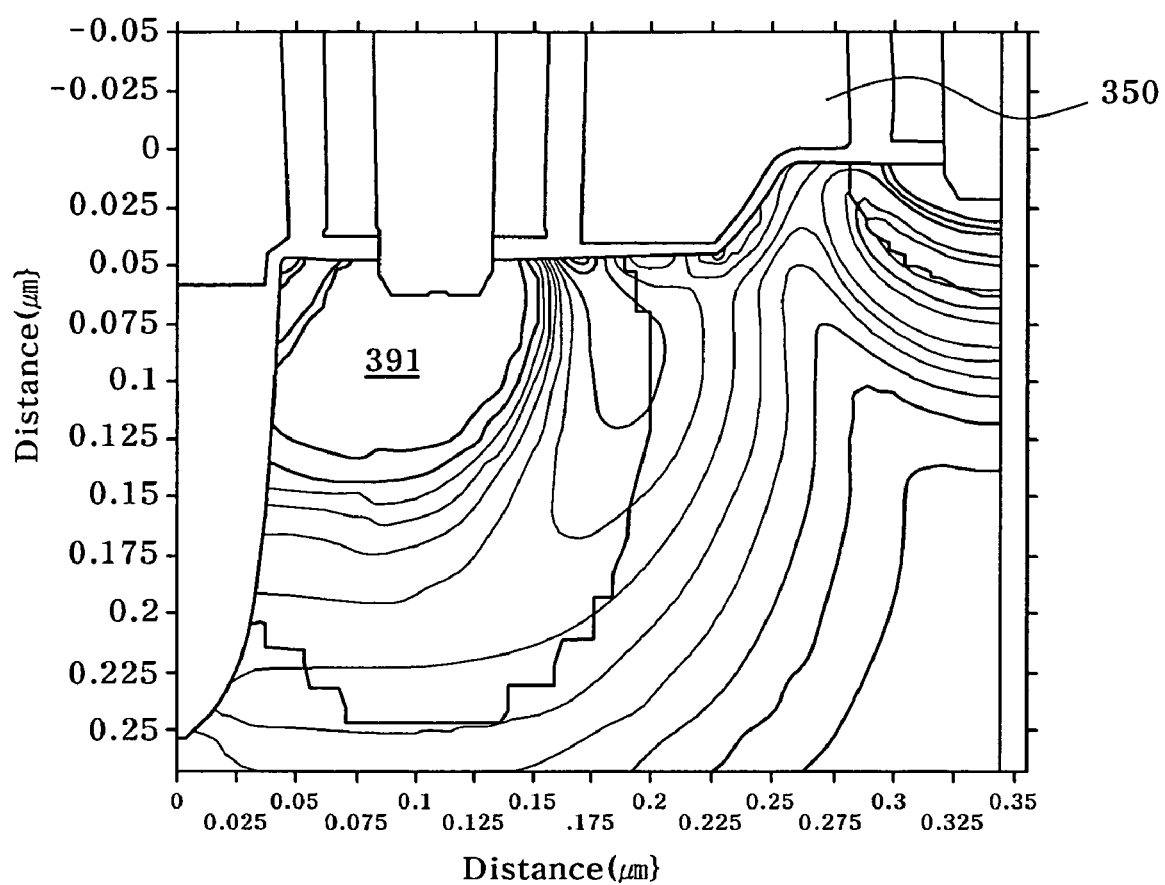

FIGS. 14 and 15 are views comparing an electric field distribution of the semiconductor memory device manufactured by the method according to the invention with that of the semiconductor memory device manufactured by a conventional method.

First, FIG. 14 shows the case where the asymmetric junction ion implantation is not performed, and the semiconductor memory device has a gate stack 350 of a step profile. In this case, it can be appreciated from an electric field contour in a storage node junction region 391 that electric field is accumulated therein, and that a higher electric field is applied thereto.

On the contrary, FIG. 15 shows the case where the asymmetric junction ion implantation is performed, and the semiconductor memory device also has the gate stack 350 of the step profile. In this case, it can be appreciated from an electric field contour in the storage node junction region 391 that the electric field is less accumulated therein than the above case, and thus electric field applied to, particularly, a region adjacent to a channel region is lower. This effect is also caused by increased asymmetry between the storage node junction region and the bit line junction region.

As apparent from the foregoing description, in the method for manufacturing the semiconductor memory device using asymmetric junction ion implantation according to the invention, the asymmetric junction ion implantation is performed using a mask layer pattern for asymmetric threshold voltage ion implantation, so that a storage node junction region has a concentration about 80% that of the conventional method, decreasing electric field applied thereto, and so that asymmetry between the storage node junction region and a bit line junction region is significantly increased, thereby enhancing the refresh characteristics. Since there is no variation in concentration of the bit line junction region, the refresh characteristics of the device can be further enhanced via improvement of a breakdown voltage in the storage node junction region while adjusting the threshold voltage upon reading data. For example, if the breakdown voltage of the storage node junction region are improved by about 0.2 V, the refresh characteristics is also improved by about 40 mV to 50 mV, thereby achieving 10% improvement in the refresh characteristics.

It should be understood that the embodiments and the accompanying drawings have been described for illustrative purposes and the invention is limited only by the following claims. Further, those skilled in the art will appreciate that various modifications, additions and substitutions are allowed without departing from the scope and spirit of the invention as set forth in the accompanying claims.

What is claimed is:

1. A method for manufacturing a semiconductor memory device, comprising the steps of:
   performing ion implantation for adjusting a threshold voltage to a semiconductor substrate;
   forming a gate stack on the semiconductor substrate to define a storage node junction region and a bit line junction region;
   implanting a first conductive impurity ion and a second conductive impurity ion using a mask layer pattern covering the storage node junction region while exposing the bit line junction region, wherein the first conductive impurity ion is implanted in a concentration of about 10% to about 30% of a final impurity concentration of the bit line junction region;
   forming a gate spacer layer at both sides of the gate stack; and
   implanting the first conductive impurity ion using the gate stack and the gate spacer layer as an ion implantation mask layer to form a storage node junction region and a bit line junction region having different impurity concentrations, and different junction depths from each other, wherein the first conductive impurity ion is implanted in a concentration of about 70% to about 90% of the final impurity concentration of the bit line junction region.

2. The method of claim 1, wherein the first conductive impurity ion is an n-type ion, and the second conductive impurity ion is a p-type ion.

3. The method of claim 1, comprising, at the step of implanting the first conductive impurity ion and the second conductive impurity ion using the mask layer pattern, implanting the first conductive impurity ion prior to implanting the second conductive impurity ion, or vice versa.

4. The method of claim 1, comprising performing the step of implanting the first conductive impurity ion and the second conductive impurity ion using the mask layer pattern after forming the gate spacer layer.

5. A method for manufacturing a semiconductor memory device, comprising the steps of:
   forming trenches for a recess channel on a semiconductor substrate;
   performing ion implantation for adjusting a threshold voltage to the semiconductor substrate having the trenches for the recess channel formed thereon;
   forming an upwardly protruded gate stack on the semiconductor substrate while burying the trenches for the recess channel to define a storage node junction region and a bit line junction region;
   implanting a first conductive impurity ion and a second conductive impurity ion using a mask layer pattern covering the storage node junction region while exposing the bit line junction region, wherein the first conductive impurity ion is implanted in a concentration of about 10% to about 30% of a final impurity concentration of the bit line junction region;
   forming a gate spacer layer at both sides of the gate stack; and
   implanting the first conductive impurity ion using the gate stack and the gate spacer layer as an ion implantation mask layer to form a storage node junction region and a bit line junction region having different impurity concentrations, and different junction depths from each other, wherein the first conductive impurity ion is implanted in a concentration of about 70% to about 90% of the final impurity concentration of the bit line junction region.

6. The method of claim 5, wherein the first conductive impurity ion is an n-type ion, and the second conductive impurity ion is a p-type ion.

7. The method of claim 5, comprising at the step of implanting the first conductive impurity ion and the second conductive impurity ion using the mask layer pattern, implanting the first conductive impurity ion prior to the second conductive impurity ion, or vice versa.

8. The method of claim 5, comprising performing the step of implanting the first conductive impurity ion and the second conductive impurity ion using the mask layer pattern after forming the gate spacer layer.

* * * * *